(12) United States Patent
Chung

(10) Patent No.: US 7,913,000 B2
(45) Date of Patent: Mar. 22, 2011

(54) STACKED SEMICONDUCTOR MEMORY DEVICE WITH COMPOUND READ BUFFER

(75) Inventor: Hoe-ju Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 332 days.

(21) Appl. No.: 12/186,040

(22) Filed: Aug. 5, 2008

(65) Prior Publication Data

US 2009/0319703 A1 Dec. 24, 2009

(30) Foreign Application Priority Data

Jun. 23, 2008 (KR) .................. 10-2008-0059055

(51) Int. Cl.
*G06F 3/00* (2006.01)
*G06F 13/00* (2006.01)

(52) U.S. Cl. .................. 710/52; 710/5; 710/36; 711/100

(58) Field of Classification Search .................. None
See application file for complete search history.

(56) References Cited

U.S. PATENT DOCUMENTS

2009/0300314 A1* 12/2009 LaBerge et al. ............... 711/167
* cited by examiner

*Primary Examiner* — Alan Chen
(74) *Attorney, Agent, or Firm* — Volentine & Whitt, PLLC

(57) ABSTRACT

A stacked memory apparatus operating with a compound read buffer is disclosed. The stacked memory apparatus includes an interface device having a main buffer and a plurality of memory devices each having a device read buffer. Systems incorporating one or more stacked memory apparatuses and related method of performing a read operation are also disclosed.

25 Claims, 14 Drawing Sheets

TO FIG. 8B

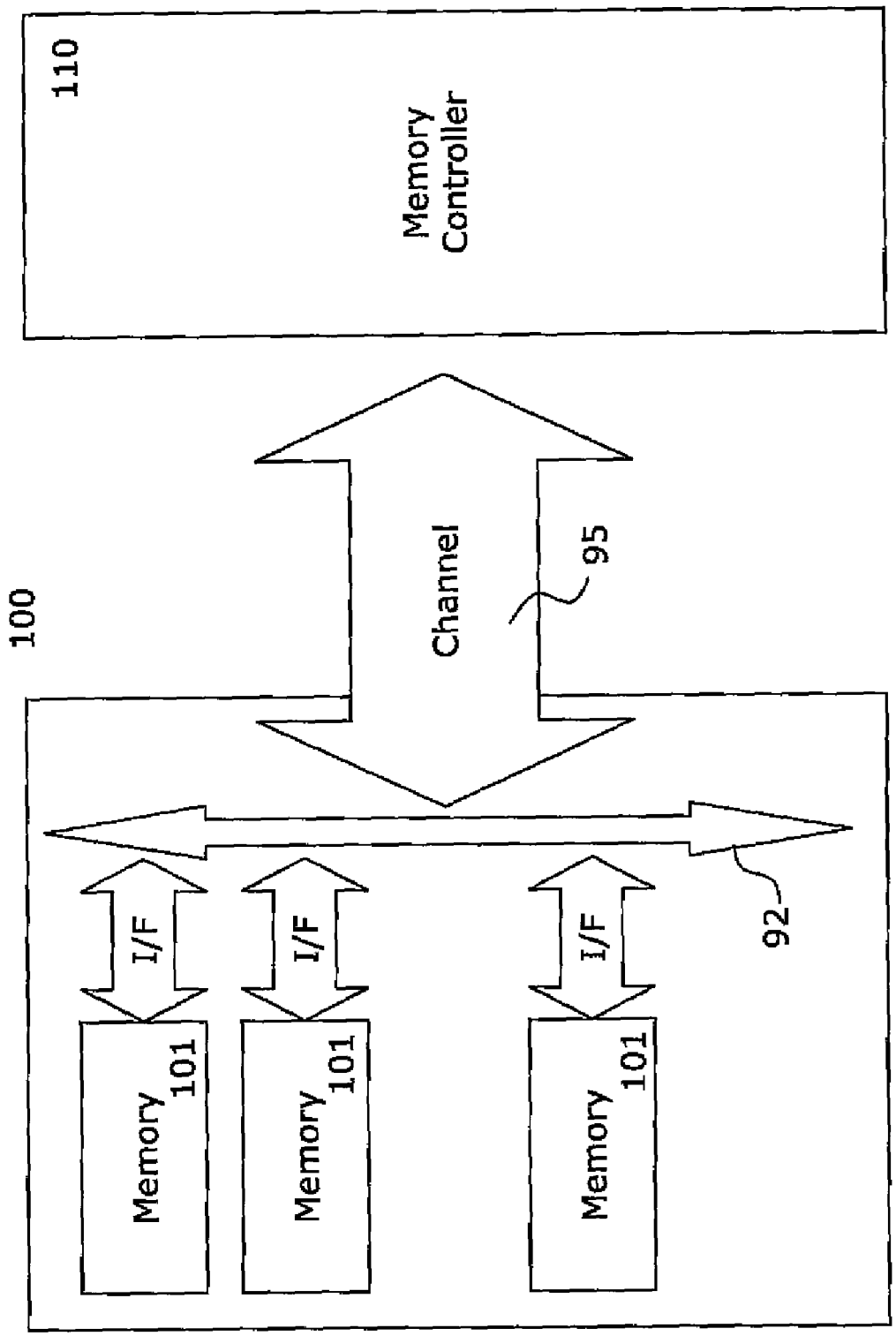

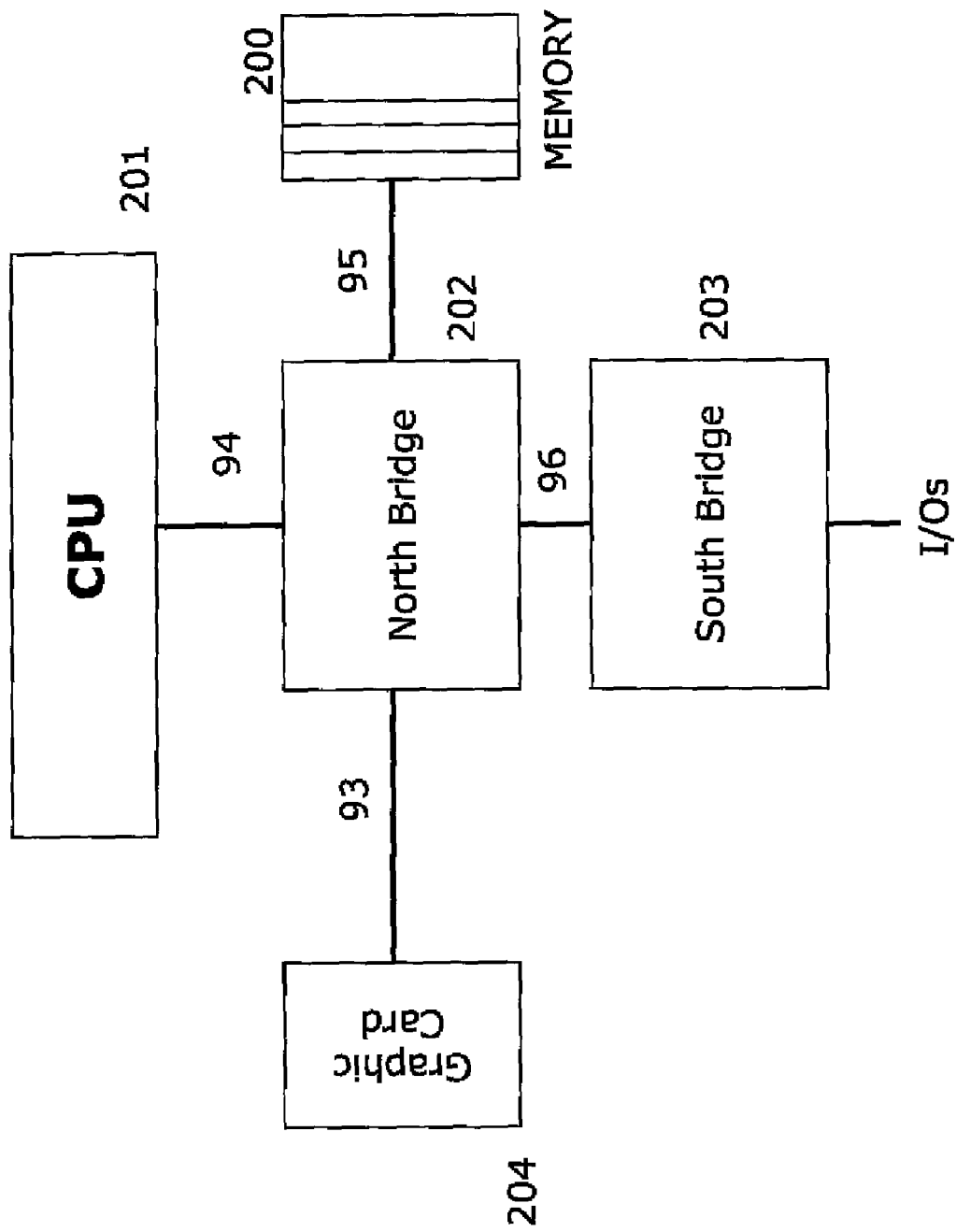

US 7,913,000 B2

STACKED SEMICONDUCTOR MEMORY DEVICE WITH COMPOUND READ BUFFER

CROSS-REFERENCE TO RELATED PATENT APPLICATION

This application claims the benefit of Korean Patent Application No. 10-2008-0059055 filed on Jun. 23, 2008, the subject matter of which is hereby incorporated by reference.

BACKGROUND OF THE INVENTION

1. Field of the Invention

The present invention relates to semiconductor memory apparatuses and systems, and related methods of performing read operations. More particularly, the invention relates to stacked semiconductor memory apparatus and systems, and related methods of performing read operations using a compound read buffer.

2. Description of the Related Art

The emergence of mobile consumer electronics, such as cellular telephones, laptop computers, Personal Digital Assistants (PDAs), and MP3 players to name but a few, has increased the demand for compact, high performance memory devices. In many ways, the modern development of semiconductor memory devices may be viewed as a process of providing the greatest number of data bits at defined operating speeds using the smallest possible device. In this context, the term "smallest" generally denotes a minimum area occupied by the memory device in a "lateral" X/Y plane, such as a plane define by the primary surfaces of a printed circuit board or module board.

Not surprisingly, restrictions of the tolerable lateral area occupied by a memory device have motivated memory device designers to vertically integrate the data storage capacity of their devices. Thus, for many years now, multiple memory devices that might have been laid out adjacent to one another in a lateral plane have instead been vertically stacked one on top of the other in a Z plane relative to the lateral X/Y plane.

Recent developments in the fabrication of so-called "Through Silicon Vias (TSVs)" have facilitated the trend towards vertically stacked semiconductor memory devices. TSVs are vertical connection elements that pass substantially, if not completely, through a substrate and are fully contained within the periphery of the stacked substrates. TSVs are distinct from and have largely replaced vertical connection elements running up the outer edges of stacked memory devices. Such external wiring (i.e., wiring disposed on the periphery) was conventionally required to operatively connect the stacked devices. But this wiring increases the overall lateral area occupied by the stacked device and typically requires interposing layers between adjacent substrates in the stack. Because TSVs pass vertically upward through a substrate, no additional lateral area is required beyond that defined by the periphery of the largest substrate in the stack. Further, TSVs tend to shorten the overall length of certain critical signal paths through the stack of devices, thereby facilitating faster operating speeds.

Stacked semiconductor memory devices are one type of three dimensional (3D) integrated circuits. That is, from the standpoint of other system components such as a memory controller, a 3D memory apparatus functions as an integral memory device. Data write and data read operations are processed by the 3D memory device in order to store write data or retrieve read data in ways generally applicable to non-stacked (i.e., single substrate) memory devices. Yet, the 3D memory apparatus is able to store and provide a great deal more data per unit lateral surface area, as compared with a non-stacked memory device.

Thus, through the use of TSVs or similar stack fabrication processes, memory apparatuses implemented with a plurality of vertically stacked memory devices are able to store and provide a large amount of data using a single integrated circuit having a relatively small lateral surface area footprint. However, surface area efficient storage and retrieval of data from a 3D memory apparatus poses a number of related challenges to the memory apparatus and system designer.

Consider for the moment the conventional single layer Dynamic Random Access Memory (DRAM) 8 shown in Figure (FIG.) 1. A DRAM memory core 10 comprises a great number of individual memory cells arranged in relation to a matrix of row and column signal lines. Each memory cell is able to store write data in response to a write command and provide read data in response to a read command received from an external device (not shown), such as a memory controller or processor. Read/write commands result in the generation of certain control signals (e.g., a row address, a column address, enable signals, etc.) which along with certain control voltages are applied to memory core 10 through related peripheral devices, such as row decoder 12 and column decoder 11.

During a write operation, write data (i.e., data intended to be stored in memory core 10) passes from the external circuit (e.g., an external memory, an external input device, a processor, a memory controller, a memory switch, etc.) to a write buffer 14 through a write control circuit 15. Once stored in write buffer 14, the write data may be written to memory core 10 through conventional functionality associated with an Input/Output (I/O) driver 13 which may include, for example, sense amplifier and page buffer circuitry.

During a read operation, applied control voltages, as well as the control signal outputs of row decoder 12 and column decoder 11 generally cooperate to identify and select one or more memory cell(s) in memory core 10 and facilitate the provision of signals indicating the value of data stored in the memory cell(s). The resulting "read data" typically passes through I/O driver 13 to be stored in a read buffer 16. Read data stored in read buffer 16 may be subsequently provided to the external circuit under the control of read control circuit 17.

In the foregoing example, write buffer 14 and read buffer 16 are generally used to harmonize the timing characteristics associated with the data access and transfer functionality within DRAM 8 with different timing characteristics associated with the external circuit (i.e., synchronous input/output requirements defined by an external clock signal). Stated in other terms, write buffer 14 and read buffer 16 are used to respectively to control the write data and read data latencies for DRAM 8 in relation to the requirements of the external circuit.

SUMMARY OF THE INVENTION

In one embodiment, the present invention provides a stacked memory apparatus providing read data in response to a read command. The stacked memory device comprises an interface device and a plurality of memory devices. The interface device comprises a main control circuit configured to generate a main buffer output signal and a main buffer input signal, and a main buffer configured to provide the read data to an external circuit in response to the main buffer output signal. The plurality of memory devices vertically stacked on the interface device, wherein each memory device in the plurality of memory devices comprises; a memory core configured to provide the read data in response to a device read signal, a device buffer configured to receive the read data from the memory core in response to a device buffer input signal and provide the read data to the main buffer in response to a device buffer output signal, and a device control circuit receiving the read command and the main buffer input signal, and configured to generate the device read signal in response to the read command, the device buffer input signal in relation to a read data access delay associated with the memory core, and the device buffer output signal in relation to the main buffer input signal.

In another embodiment, the invention provides a system comprising; at least one memory apparatus and a processor communicating to the at least one memory apparatus a read command identifying read data. Each one of the memory apparatuses comprises an interface device and a plurality of memory devices vertically stacked on the interface device, where the interface device comprises a main control circuit configured to generate a main buffer output signal and a main buffer input signal, and a main buffer configured to provide the read data in response to the main buffer output signal, and each one of the plurality of memory devices comprises a memory core configured to provide the read data in response to a device read signal, a device buffer configured to receive the read data from the memory core in response to a device buffer input signal and provide the read data to the main buffer in response to a device buffer output signal, and a device control circuit receiving the read command and the main buffer input signal and configured to generate the device read signal in response to the read command, the device buffer input signal in relation to a read data access delay associated with the memory core, and the device buffer output signal in relation to the main buffer input signal.

In another embodiment, the invention provides a method of providing read data to an external circuit from an apparatus comprising an interface device including a main buffer, and a plurality of memory devices vertically stacked on the interface device, wherein each one of the plurality of memory devices comprise a device buffer, the method comprising; receiving a read command identifying read data stored in one of the plurality of memory devices, and generating a main read signal and a device read signal in response to the read command, delaying the main read signal by a read data output delay to generate a main buffer output signal, and delaying the main read signal by a read data compensation delay to generate a main buffer input signal, delaying the device read signal by a read data access delay to generate a device buffer input signal and generating a device buffer output signal in relation to the main buffer input signal, wherein the read data is provided by applying the device read signal to a memory core of the memory device to select the read data, applying the device buffer input signal to the device buffer of the memory device to transfer read data from the memory core to the device buffer, applying the device buffer output signal to the device buffer and the main buffer input signal to the main buffer to transfer the read data from the device buffer to the main buffer, and applying the main buffer output signal to the main buffer to transfer the read data from the main buffer to the external circuit.

In another embodiment, the invention provides a method of providing read data from an apparatus to an external circuit, the apparatus comprising; an interface device including a main buffer and a command decoder receiving a read command, a first memory device stacked on the interface device and connected to the interface device via at least one Through Silicon Via (TSV) and comprising a first memory core storing first read data and a first device buffer receiving the first read data from the first memory core, and a second memory device stacked on the first memory device and connected to at least one of the first memory device and the interface device via at least one TSV and comprising a second memory core storing second read data and a second device buffer receiving the second read data from the second memory core, wherein a first data access time associated with accessing and providing the first read data from the first memory core is different from a second data access time associated with accessing and providing the second read data from the second memory core. The method comprises; upon receiving a read command identifying the first read data, generating a first main read signal in the interface device and a first device read signal in the first memory device, delaying the first main read signal by a read data output delay to generate a main buffer output signal, and delaying the first main read signal by a read data compensation delay to generate a main buffer input signal, delaying the first device read signal by a first read data access delay defined in relation to the first data access time to generate a first device buffer input signal and generating a first device buffer output signal in relation to the main buffer input signal; wherein the first read data is provided by, applying the first device read signal to the first memory core to select the first read data, applying the first device buffer input signal to the first device buffer to transfer the first read data to the first device buffer, applying the first device buffer output signal to the first device buffer and the main buffer input signal to the main buffer to transfer the first read data from the first device buffer to the main buffer, and applying the main buffer output signal to the main buffer to transfer the first read data from the main buffer to the external circuit.

BRIEF DESCRIPTION OF THE DRAWINGS

FIG. 11 is a memory system incorporating one or more stacked memory apparatuses according to an embodiment of the invention.

FIG. 12 is a data intensive computational system incorporating one or more stacked memory apparatuses according to an embodiment of the invention.

DESCRIPTION OF EMBODIMENTS

The present invention will now be described more fully with reference to the accompanying drawings in which exemplary embodiments of the invention are shown. The teachings associated with the illustrated embodiments of the invention that follow, while drawn to specific illustrated examples, are widely applicable to a broad range of memory apparatuses, systems incorporating such memory apparatuses, and related methods of operation. Thus, the scope of the invention is not limited to only the illustrated embodiments. For example, certain illustrated examples are drawn to stacked DRAM devices, but the invention in not limited to only memory apparatuses incorporating DRAMs. Other types of volatile memory, such as the Static Random Access Memory (SRAM), may be used to implemented a memory apparatus according to an embodiment of the invention. Further, non-volatile memory devices, such as NAND and NOR flash memory devices, may similarly be used to implemented a memory apparatus according to an embodiment of the invention. In certain embodiments of the invention both volatile and non-volatile memory devices may be mixed within a stacked of plurality of memory devices. In other embodiments of the invention, volatile and non-volatile memory devices as well as a related computational logic device or a signal processing device may be mixed within a stacked of plurality of memory devices.

Certain embodiments of the invention are drawn to a memory apparatus comprising a stacked plurality of memory devices where each memory device incorporates one or more TSVs as vertical connection element(s). However, the scope of the invention is not limited to only apparatuses implemented using TSVs. Any type or configuration of stacked semiconductor device, whether memory and/or computational in its functional nature, and whether implemented using TSVs and/or some other form of vertical connection element(s), may be susceptible to the advantages and benefits afforded by the present invention.

Embodiments of the invention are not limited to only single apparatuses (or single package integrated circuits). Rather, a stacked memory apparatus according to an embodiment of the invention may be incorporated within a memory system, a computational logic platform, or a host device (e.g., a mobile electric device, a personal computer, a consumer electronics product, etc.) in order to provide greater data storage capacity per unit lateral surface area occupied by the constituent memory apparatus. Yet, a memory apparatus according to an embodiment of the invention, despite the use of multiple memory devices with varying data access characteristics, may be readily used with synchronous data access operations defined in relation to a clock signal generated external to the memory apparatus. Accordingly, embodiments of the invention include system and method embodiments, as well as apparatus embodiments.

Figure 1:
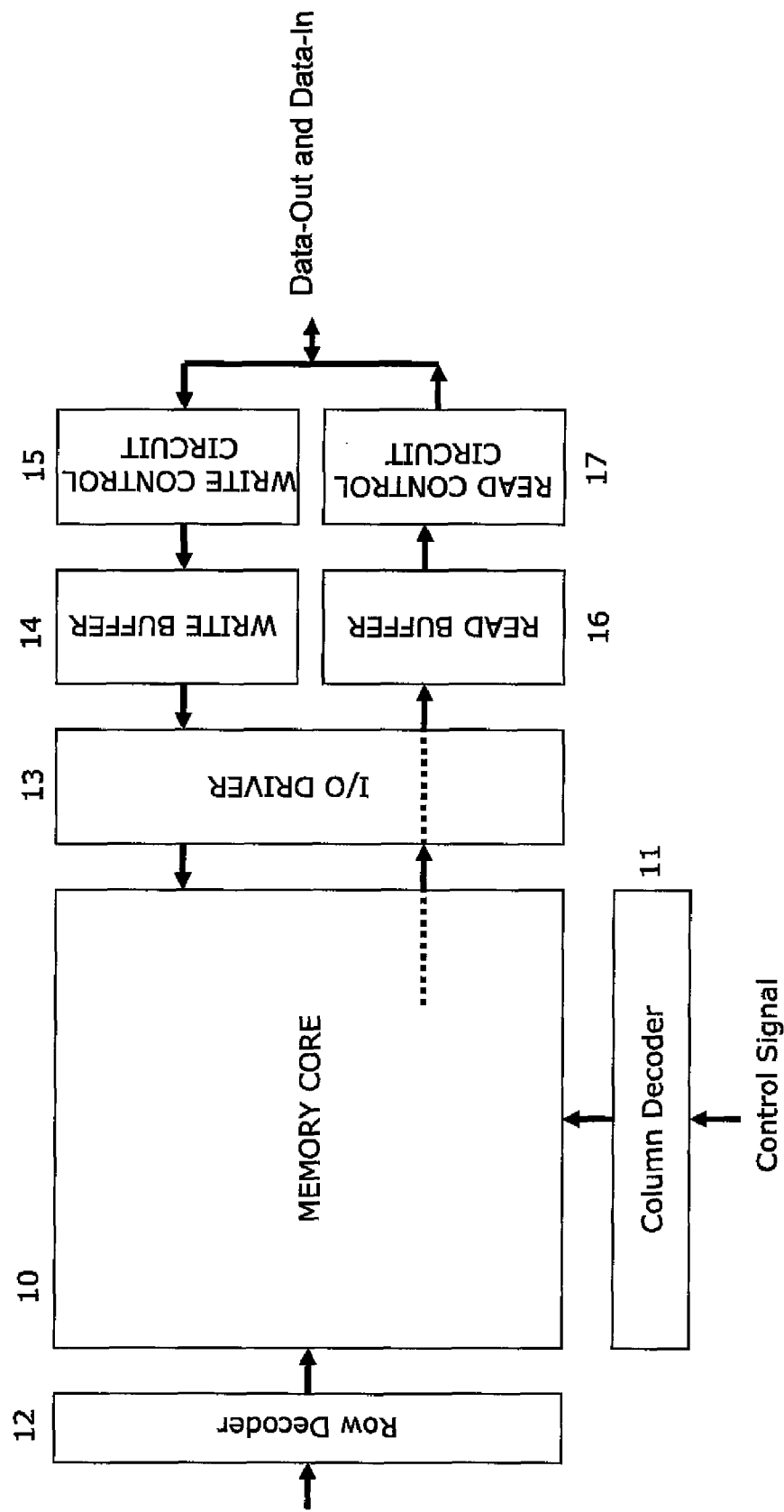
FIG. 1 illustrates a conventional DRAM.
Figure 2:
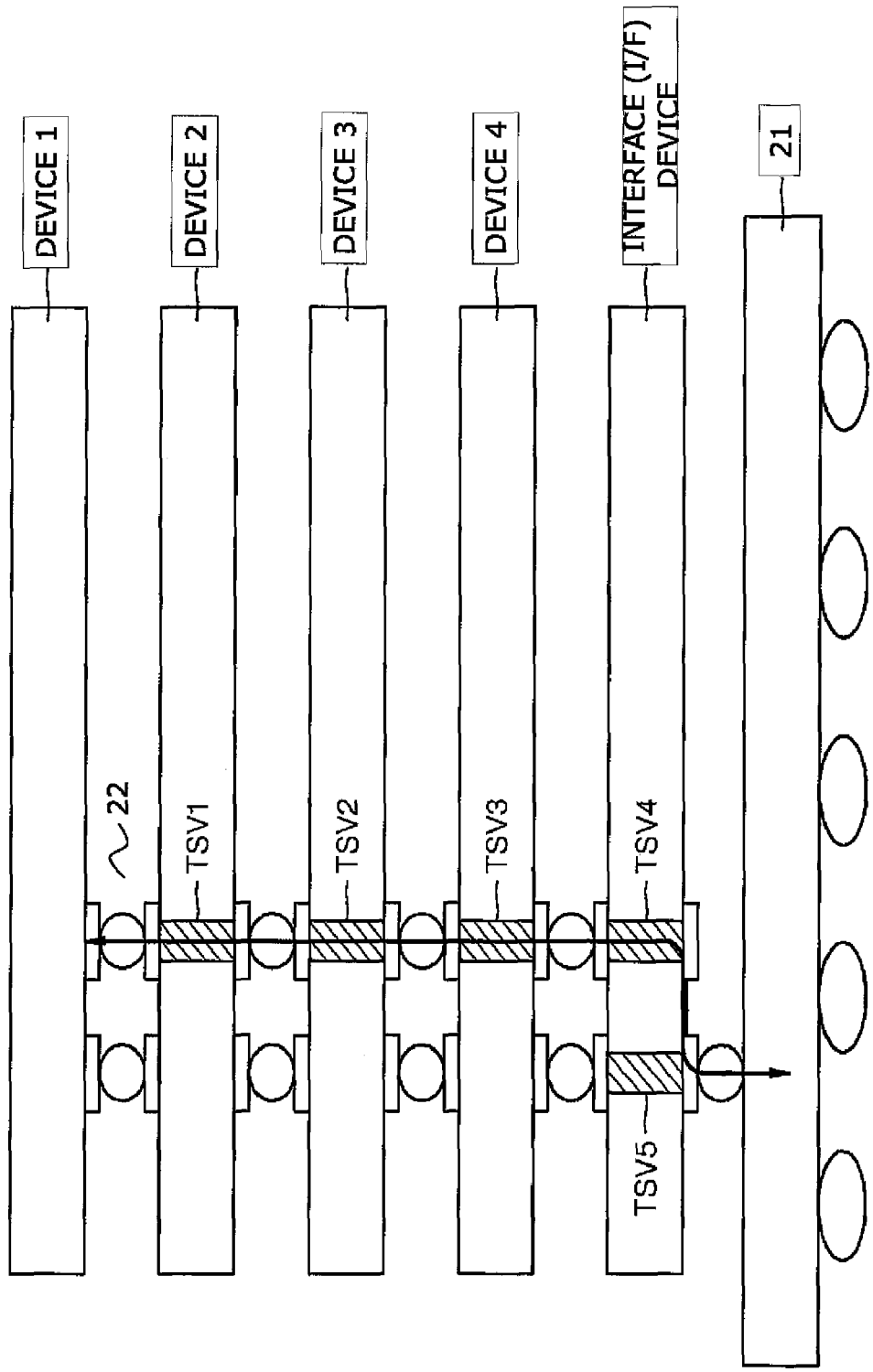
FIG. 2 illustrates a conventional stacked memory apparatus.

FIG. 2 generally illustrates a conventional stacked memory apparatus 20 including a plurality of memory devices (device 1 through device 4), vertically integrated one on top of the other and collectively arranged on an interface (I/F) device. For purposes of the present discussion, individual DRAM devices, like the one described in relation to FIG. 1, may be assumed for the plurality of memory devices (device 1 through device 4), and a similarly configured DRAM or a compatible memory controller may be assumed for the interface device.

Memory apparatus 20 may be mounted on a packaging substrate 21 (e.g., a printed circuit board, a flexible tape substrate, a memory module board, etc.). Packaging substrate 21 may be connected to an external circuit using conventional techniques and components. A variety of signals (e.g., data, address and control) are conventionally communicated from one or more external circuit(s) to memory apparatus 20 via packaging substrate 21. One or more of these signals may be communicated up though the stacked plurality of memory devices using a collection of signal lines implemented, at least in part, using one or more TSVs. For example, one signal line 22 may be viewed as one signal line in collection of parallel signal lines used to communicate an address signal from the interface device to each one of the stacked plurality of memory devices. Signal line 22 may implemented using TSV1 through TSV4, along with conventional ball and pad landing connection elements. Each one of TSV 1 through TSV4 respectively extends through the substrate of the interface device and memory devices 4 through 2 to reach memory device 1.

As is well understood in the art, other TSVs, like TSV5, may be used locally to facilitate signal or voltage communication within a single device (e.g., the interface device in the illustrated example). Additionally, one or more TSVs may be used to implement a serial signal path extending upward through all or part of the stacked plurality of memory devices. TSVs may be implemented in many different ways. See, for example [Ser. Nos. 12/352,735 and 12/245,928], the collective subject matter of which is hereby incorporated by reference.

Figure 3:
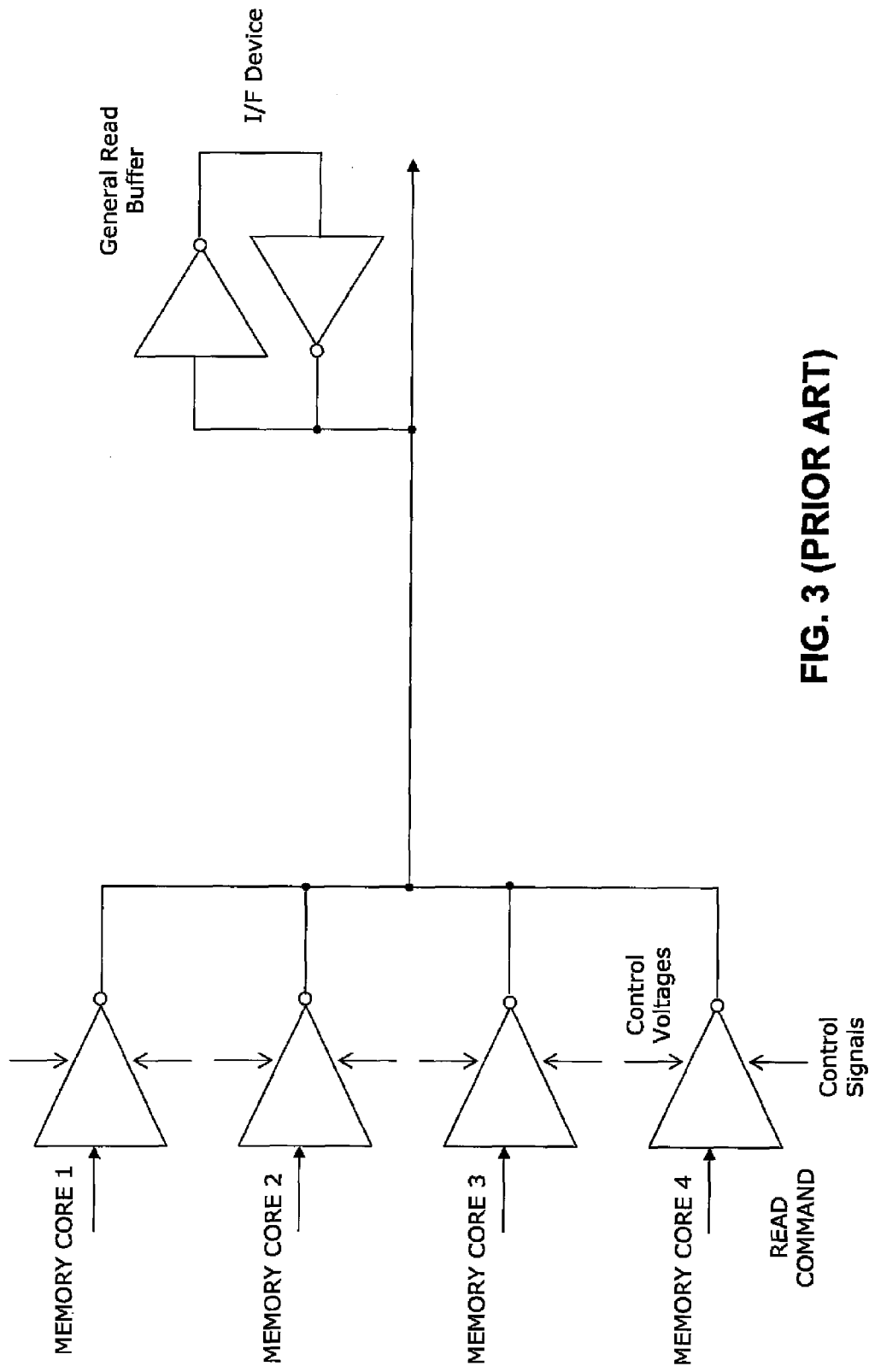
FIG. 3 illustrates a read buffer disposition issues related to the conventional stacked memory apparatus of FIG. 2.

As previously noted, the general configuration of memory devices stacked on a designated interface device allows a large amount of data to be stored using a memory apparatus having a relatively small lateral footprint. In large part, conventional memory device selection or enable control signaling, along with conventional memory space allocation and data addressing techniques may be used to read and write data from/to a stacked memory apparatus according to an embodiment of the invention. However, the retrieval of read data from multiple memory cores in a stacked memory apparatus poses several new problems that must be faithfully resolved. One such problem will be explained with reference to FIG. 3 which is a conceptual illustration of a read buffer configuration associated with a conventional stacked memory apparatus, such as the one shown in FIG. 2.

Read data may be independently read from any one (or more than one) of the memory cores associated with the plurality of memory devices in response to a read command communicated to the memory apparatus by an external circuit. Yet the time required to effectively apply the conventionally understood control signals derived from (or contained in) the read command and the corresponding control voltages (e.g., bitline and wordline) to the memory cells actually storing the identified read data will vary from memory device to memory device, and from stored read data location to stored read data location in memory. Furthermore, the time required to transfer signals indicative of the stored read data from the selected memory core and properly set-up the these data value signals in a corresponding read buffer will also vary from memory device to memory device. Hence, the actual time expiring between receipt of a read command in the memory apparatus and the useable arrival of read data in a read buffer associated with each memory device will vary with memory device. This collective period of time will hereafter be referred to as the memory device's "read data access and buffer time." Some portion of this cumulative read data access and buffer time may result from the varying lengths of the signal paths used to select, transfer, and store the read data. Another portion of the read data access and buffer time may result from different operating characteristics associated with each memory device. That is, variations in process, temperature, and voltage associated with the fabrication and/or operation of each memory device may result in a different read data access and buffer times. Thus, the data access and buffer time for each memory device may be seen as an asynchronous delay (or memory device read latency) between receipt of the read command and the useable receipt (or completed latching) of the identified read data in a corresponding read buffer.

This operational reality has several important implications for the design of a memory apparatus comprising a plurality of memory devices. With comparative reference to FIGS. 1 through 3, for example, the question becomes one of how (or where) does one implement the equivalent of read buffer 16 shown in FIG. 1 in the stacked memory apparatus of FIG. 3, when read data may be provided from any one of the plurality of memory devices? If respective alternate read buffers holding read data prior to export to an external circuit are implemented as part of each one of the plurality of memory devices, the overall memory apparatus of FIG. 3 will exhibit multiple operating frequencies as each memory device may provide read data according to its own unique read access and buffer time characteristic. This outcome is clearly unacceptable since it would force all possible external systems to accommodate variable read data output timing from the memory apparatus.

However, merely configuring the memory apparatus with a single "general read buffer" (i.e., a single read buffer associated with the interface device and holding read data received from each one of the plurality of memory devices prior to export) raises an entirely different set of problems. Namely, the general read buffer must be implemented with considerable data depth. Assuming for the moment that the general read buffer is implemented using a First-In, First-Out (FIFO) configuration, the resulting FIFO buffer must be designed with very great data deep in order to accommodate all possible variations in the read data access and buffer times associated with read data outputs from the plurality of memory devices. That is, the timing and control domain for the general read buffer must cover (or compensate for) all read data outputs possibly provided by the plurality of memory devices. Such a design is operationally inefficient and would be subject to change with variation in the range of read data latency control for the memory apparatus or its constituent plurality of memory devices. This is also an unacceptable design outcome.

In contrast to the foregoing conventional solutions, embodiments of the invention include stacked memory apparatuses, systems incorporating one or more stacked memory apparatuses, and related methods of operation that provide read data through a compound read buffer. The term "compound" is used to distinguish conventional apparatuses that include a read buffer implemented by only a single buffer circuit component disposed between a memory core and an output pad providing the read data to the external circuit. The phrase "single buffer circuit component" in this explanation is not merely a hardware description, because those of ordinary skill in the art understand that buffers may be variously designed using any number circuits and circuit components such as registers, latches, memories, flip-flops, etc. Rather, the phrase "single buffer circuit component" has reference, at least in relation to certain embodiments of the invention, to a circuit adapted to provide a time domain crossing function for the read data being communicated from memory core to external circuit. A read data buffer, such as a FIFO, may be used to straddle two different time domains in which data is stored or manipulated within a circuit or sub-system. For example, if an internal control signal generated by a memory device controls (or gates) the input of read data to a buffer, but an external control signal such as an externally applied clock signal controls the output of the buffer, the buffer allows the read data to cross from (or straddle over) an internal time domain defined in relation to the internal control signal and an external time domain defined in relation to the external clock signal. Whereas, a single buffer circuit component is only able to straddle two time domains, a compound buffer is able to straddle multiple time domains.

Thus, a compound read buffer, as illustrated in the embodiments that follow, comprises at least two (2) buffer circuit components—one buffer circuit component disposed in the interface device and straddling an interface device time domain and an external circuit time domain, and at least one other buffer circuit component disposed in one or more of a plurality of stacked memory devices and straddling a device time domain and the interface device time domain. By using a compound read buffer, embodiments of the invention are able to effectively and efficiently straddle the multiple time domains that exist within the operating environment of the stacked memory apparatus. This concept will be illustrated in some additional detail hereafter.

Figure 4:
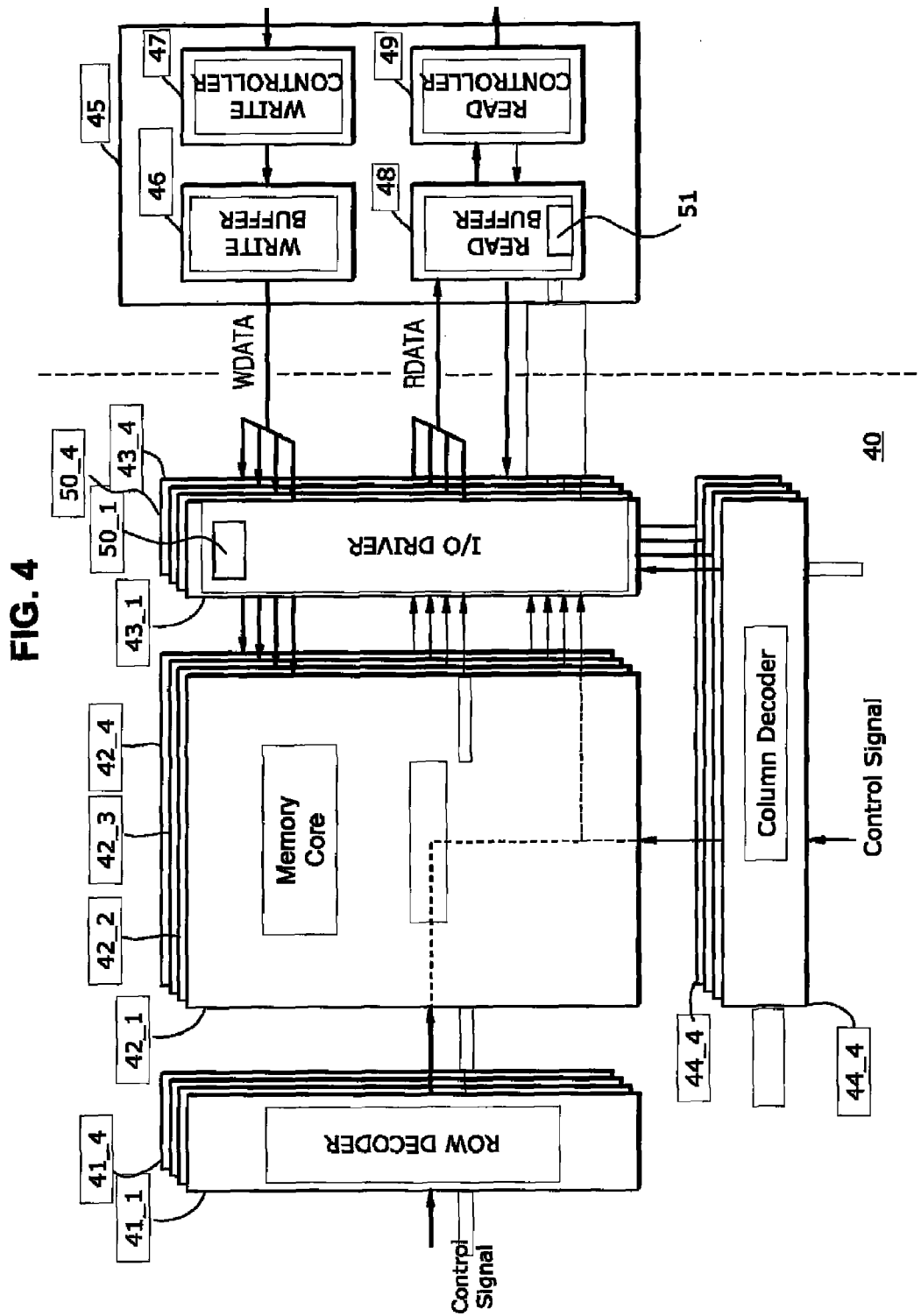
FIG. 4 is a stacked memory apparatus according to an embodiment of the invention.

FIG. 4 illustrates a stacked memory apparatus incorporating a compound read buffer according to an embodiment of the invention. The compound read buffer in this particular embodiment comprises a main buffer 51 disposed in an interface device 45 and multiple device buffers 50_1 through 50_4, respectively associated with and disposed in I/O devices 43_1 through 43_4 of a plurality of memory devices 40. In the embodiment of FIG. 4, the plurality of memory devices 40 includes four (4) individual memory devices operatively arranged in a stacked configuration on interface device 45. Of course, the number of memory devices selected for this embodiment is entirely arbitrary, and so long as at least two memory devices (e.g., two stacked memory devices where one serves as the interface device) are used in a memory apparatus, the memory apparatus would fall within the scope of the invention.

Returning to FIG. 4, each one of the plurality of memory devise 40 comprises a memory core 42_1 through 42_4 and associated row decoders 41_1 through 41_4 and column decoders 44_1 through 44_4. The illustrated row decoders and column decoders are merely indicative of a broad class of peripheral circuits, signal lines, and related components that may be used to select, access and/or transfer read data in relation to a memory core. The illustrated embodiment of FIG. 4 is drawn to a DRAM based memory apparatus, but other types of memory devices may be used with conventionally understood changes to the corresponding peripheral circuits.

Various conventionally understood control signals are applied to one or more of the peripheral circuits and various control voltages and signals are applied to a corresponding memory core from a voltage generator disposed in the peripheral circuits in order to obtain read data identified by the read command (i.e., read data identified by an address associated with or contained in the read command). Read data obtained from one or more of the plurality of memory core(s) 42_1 through 42_4 is received and stored by a corresponding device buffer 50_1 through 50_4 configured within an Input/Output (I/O) driver 43_1 through 43_4 associated with memory core 42_1 through 42_4. In certain embodiments of the invention each I/O driver 43_n will comprise conventionally understood sense amplifier and page buffer circuitry. Each device buffer 50_1 through 50_4 is configured to provide read data received from a corresponding memory core 42_1 through 42_4 to a main buffer 51 disposed in the read buffer circuitry 48 of interface device 45. The read data stored in main buffer 51 may then be provided to an external circuit via read controller 49.

Write buffer 46 and write controller 47 are assumed to be conventional in their configuration and operation for purposes of this description.

The disposition of each device buffer 50_1 through 50_4 in relation to each one of the plurality of memory devices is merely one example of several possible device buffer dispositions. For example, a single read buffer might be disposed on a selected one of the plurality of memory devices and commonly used by all memory devices, or adjacent memory devices might use a common device buffer. However, the provision and disposition of individual device buffers on each individual memory device ensures that each device buffer operates under similar environmental/fabrication conditions (e.g., process, temperature, voltage, etc.) as the memory core from which it receives read data. In certain embodiments of the invention, this may prove a valuable advantage.

In a similar vein, the embodiment of FIG. 4 provides the main buffer 51 is disposed within the circuitry of the otherwise conventional read buffer 48. While this disposition most closely approximates the architecture of some analogous conventional memory apparatuses, main buffer 51 may be otherwise disposed within interface device 45. Alternately, a plurality of main buffers may be provided in interface device 45, where each main buffer in the plurality of main buffers is used to communicate read data to a different destination (e.g., an internal data bus associated with a memory sub-system time domain and an external data bus associated with an external time domain). Where a plurality of main buffers is provided one or more of the plurality of stacked memory devices may provide read data to each main buffer.

Figure 5:
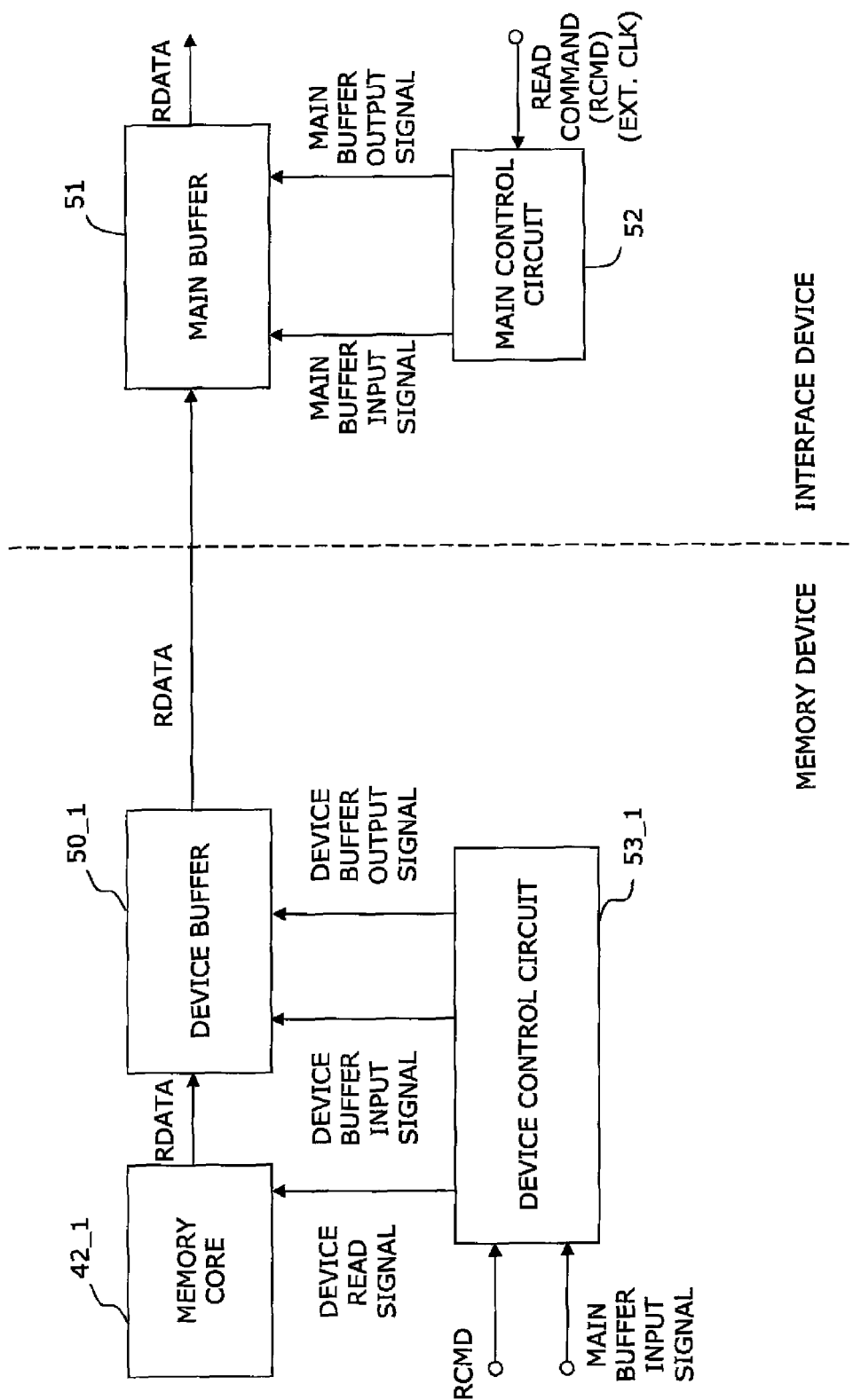
FIG. 5 is a conceptual illustration further describing the stacked memory apparatus of FIG. 4.

FIG. 5 further illustrates one possible operational relationship between various elements of the memory apparatus of FIG. 4 including the compound read buffer. In the embodiment illustrated in FIG. 5, at least the principal functionality of main buffer 51 is controlled by a main control circuit 52. Those of ordinary skill in the art will recognize that main control circuit 52 may be variously embodied using conventional techniques. For example, main control circuit 52 may be implemented using hardware circuits responsive to control signals and/or using the functionality of a processor or specialized controller resident on interface device 45, together with associated software or firmware. In this regard, interface device 45 may be implemented using a master memory device having augmented computational and control functionality over common (or slave) memory devices in the plurality of memory devices 40. Alternately, interface device 45 may be implemented using a memory controller designed to facilitate and control the operation (e.g., data access operations) of each memory device in the plurality of memory devices 40. Alternately, interface device 45 may be implemented using a common memory device selected from the plurality of memory devices 40. That is, the device buffer of a selected memory device (e.g., a lowermost memory device in the plurality of memory devices 40) may be differently operated to implement the functionality of main buffer 51. In such an alternative embodiment, external control circuitry or an external memory controller may be used to generate the signals controlling operation of the selected memory device.

Regardless of specific configuration and control architecture, main control circuit 52 receives a read command (or one or more control signals derived from a read command, hereafter collectively or singularly denoted as the "read command") from an external circuit. For example, read controller 49 of FIG. 4 may pass all or some of a read command received from the external circuit to read buffer 48. Within read buffer 48 a result derived from, or a portion of the read command received from read controller 49 may be applied to main control circuit 52. Generally speaking, but not mandatory to the embodiments of the invention, the received read command may be associated with an external clock signal. This external clock signal may define the time domain (e.g., the data access timing) expected by the external device. That is, the external clock signal may control the communication of the read command to the memory apparatus from the external circuit, and the return of read data from the memory apparatus to the external circuit during a read operation.

In response to the read command (or similarly a main read signal derived from the read command), main control circuit 52 generates two control signals and applies these control signals to main buffer 51. The two control signals will be referred to as a main buffer input signal and a main buffer output signal. Consistent with its name, the main buffer input signal controls the receipt of (or gates the input of) read data into main buffer 51 from one or more device buffers associated with one or more of the plurality of memory devices 40 (e.g., 50_1 through 50_4 in FIG. 4). The main buffer output signal controls the output (or data export from the memory apparatus) of the read data to the external circuit.

The use of the main buffer input and output signals generated by main control circuit 52 in relation to the read command allows main buffer 51 to effectively straddle a time domain internal to the memory apparatus and within which the main buffer receives read data from one or more device buffer(s), and another time domain external to the interface device, such as a time domain defined in relation to the external clock signal.

A read command, as defined above and which may be the same or different as the read command applied to the main control circuit, is applied to at least one device control circuit 53_1 associated a selected one of the plurality of memory devices 40_n storing requested read data. FIG. 5 assumes that the all of the requested read data is stored in a single memory core 42_1 associated with device buffer 50_1 and controlled by a device control circuit 53_1.

Device control circuit 53_1 receives the read command and the main buffer input signal generated by main control circuit 52. In this context, the read command may be generated by a read command decoder disposed in the selected memory device. (See, FIG. 6). Alternatively, a single read command decoder in the interface device may decode an externally supplied read command and forward the resulting read command (or a differently derived version of the read command) to device control circuit 53_1. In similar vein, the main buffer input signal generated by main control circuit 52 may be directly applied to device control circuit 53_1 or a derived (e.g., a delayed) version of the main buffer input signal may be provided. However defined within an embodiment of the invention, this particular control signal, as applied to device control circuit 53_1 will be referred to as "the main buffer input signal" since its generation and provision are directly or indirectly related to the control signal generated by main control circuit 52 in response to the read command.

In response to the read command and the main buffer input signal, device control circuit 53_1 generates a read signal, a device buffer input signal and a device buffer output signal. The device read signal is applied to memory core 42_1 to select and output the read data identified by the read command. The generation and actuation of internal control signals and/or control voltages applied to memory core 42_1 to obtain the read data in response to the applied device read signal may be conventional in nature.

The receipt of read data provided by a selected memory core (e.g., memory core 42_1) in response to the device read signal and through a corresponding device buffer (e.g., device buffer 50_1) is controlled by the device buffer input signal. As will be described in some additional detail hereafter, the device buffer input signal is derived or defined in relation to the device read signal. In contrast, the output of read data from the corresponding device buffer (e.g., device buffer 50_1) to main buffer 51 is controlled by the device buffer output signal. As will be described in some additional detail hereafter, the device buffer output signal is derived or defined in relation to the main buffer input signal.

The use of respective device buffers (50_1 through 50-4) in conjunction with device buffer input and output signals generated by corresponding device control circuits (53_1 through 53_4) allows the device buffer and main buffer (collectively a compound read buffer) to effectively straddle more than one time domain associated with the plurality of memory devices, the interface device, and the external device. For example, each one of the plurality of memory devices may output read data according to a different data access and buffer time in response to a read command due to different operating conditions and performance capabilities. Despite the varying read data outputs, interface device 45 must receive read data in main buffer 51 in a manner consistent with the time domain of the interface device, or stated in other terms, in a manner consistent with the internal timing requirements of the interface device.

Thus, in the embodiment illustrated in FIG. 5, read data is provided from the memory core of one or more memory devices selected from the plurality of memory devices within a first time domain. The first time domain may be defined in relation to a first internal signal controlling the input of read data to a device buffer associated with the selected memory devices (e.g., the device buffer input signal derived from a read command). The read data is then transferred from the first time domain to a second time domain defined in relation to a second internal signal (or related set of second signals) controlling both the output of the device buffer and the input of a main buffer (e.g., the main buffer input signal derived from the read command and the device buffer output signal derived from the main buffer input signal). Finally, the read data is transferred from the second time domain to a third domain defined in relation to a third internal signal controlling the output of the main buffer (e.g., the main buffer output signal derived from the externally received read command or an associated external clock signal).

Figure 6:
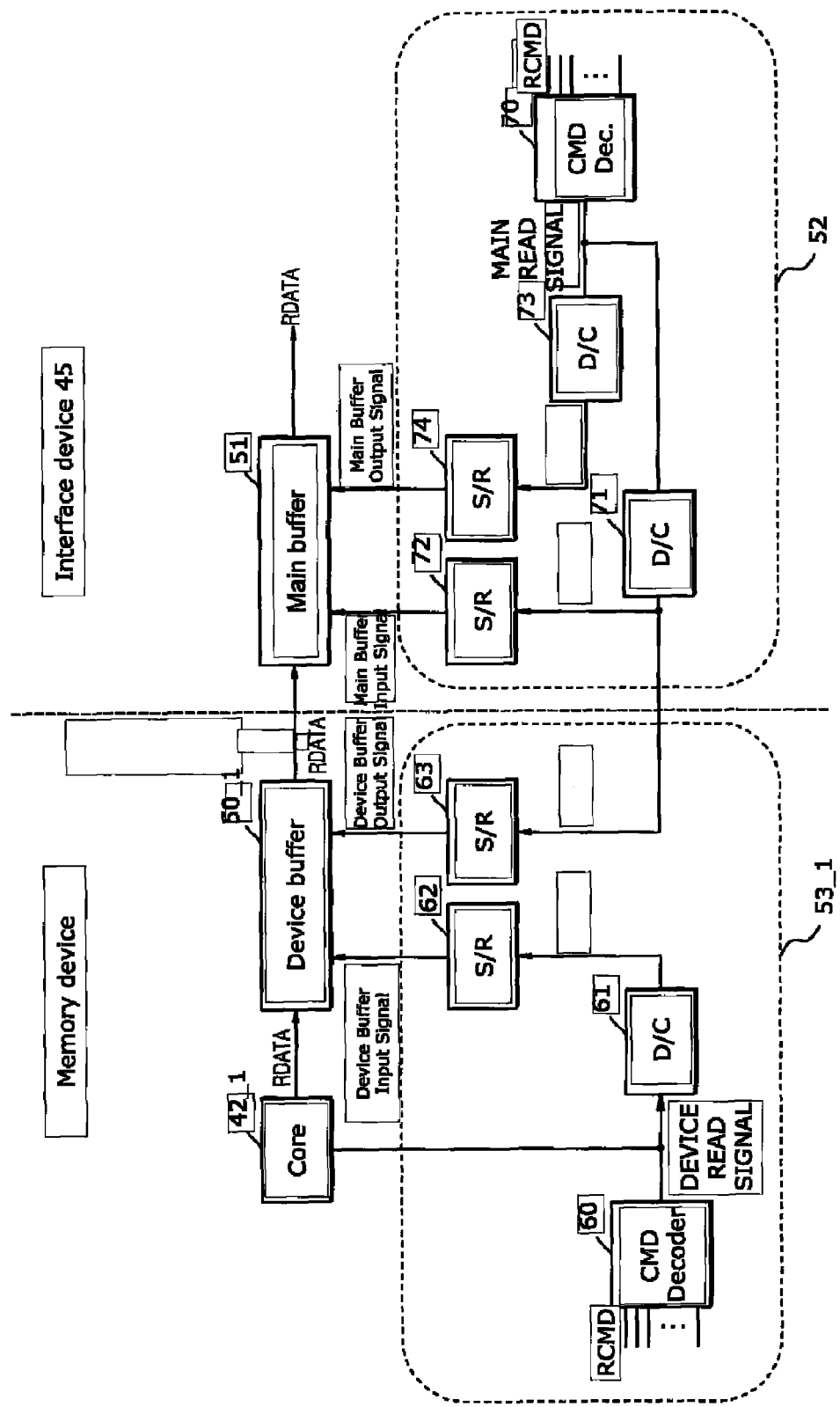
FIG. 6 is another stacked memory apparatus according to an embodiment of the invention.

FIG. 6 further illustrates possible embodiments of the main control circuit 52 and device control circuit 50_1 shown in FIG. 5. Here, both device buffer 50_1 and main buffer 51 are assumed to be FIFO buffers. At the memory device selected in relation to the read command (RCMD), a command decoder 60 receives the read command and generates a corresponding device read signal. The device read signal is applied to memory core 42_1 and to a first delay controller (D/C) 61. In conventional manner, the device read signal causes read data stored in memory core 42_1 to be identified, selected, and transferred (these operations collectively denoted as "providing the read data") to the input of device buffer 50_1. The read data is gated into device buffer 50_1 in response to the device buffer input signal provided by device control circuit 53_1.

In the illustrated example of FIG. 6, device control circuit 53_1 generates the device buffer input signal by delaying the device read signal through first delay controller 61 and then applying the delayed device read signal to an input gating element of device buffer 50_1 as device buffer input signal via an input shift register 62. The provision of the input shift register within this embodiment, as with other shift registers described in the embodiments that follow, is optional.

In one embodiment of the invention consistent with the configuration shown in FIG. 6, first delay controller 61 imparts a delay to the device read signal that is equivalent to (or calculated in accordance with) the data access and buffer time associated with memory core 42_1. Thus, read data provided by memory core 42_1 may be gated into device buffer 50_1 in a manner consistent with the actual arrival of constituent bits of read data at the input of FIFO device memory buffer 50_1. In this context, device buffer 50_1 may be implemented using a single stage First-In, First-Out (FIFO) circuit. However, while this particular implementation is simple and very straight-forward to control, it necessarily limits the output data tracking range.

Device control circuit 53_1 also applies the device buffer output signal to an output gating element of device buffer 50_1 through an output shift register 63. In certain embodiment of the invention, the main buffer input signal generated by main control circuit 52 may be directly applied to device buffer 50_1 to control its output. In this context, the term "directly applied" does not refer simply to the absence of an intervening hardware element such as output register 63. Rather, a control signal such as the device buffer output signal in the example of FIG. 6 that is directly applied to a corresponding circuit has not been materially and intentionally altered in its properties (e.g., phase, polarity, frequency, etc.) before being applied. Thus, as illustrated in FIG. 6, the main buffer input signal may be said to be directly applied to device buffer 50_1 through output shift register 63, despite the fact that output shift register necessarily imparts a small delay to the control signal.

In other embodiments of the invention, however, certain control signals may be additionally processed before being applied to the control of a circuit or circuit component. For example, if it were determined that a material time delay, phase shift, control signal polarity inversion, and/or frequency adjustment were desirable between the main buffer input signal as generated by the main control circuit 52 and the device buffer output signal as applied to device buffer 50_1, device control circuit 53_1 might be modified to include conventionally understood circuitry to accomplish the desired control signal adjustment. Nonetheless, even in embodiments where the device buffer output signal (or any other control signal) is derived by such modification, it is still correctly described as being generated "in relation to the man buffer input signal" (or some other pre-existing control signal). So long as the applied signal processing of the main buffer input signal results in the generation of the device buffer output signal that allows for the coherent transfer of read data from device buffer 50_1 to main buffer 52 in order to effectively provide any requisite time domain crossing, the device buffer output signal may be said to be generated "in relation to" the main buffer input signal.

Returning to FIG. 6 and interface device 45, a command decoder 70 receives a read command (RCMD) and generates a main read signal. The main read signal, consistent with the foregoing description, may be a delayed version of the read command, a portion of the read command, or an internal read command (or similar control signals) derived from the externally provided read command (RCMD). The main read signal is then applied to first and second delay controllers 71 and 73. First delay controller 71 delays the main read signal by a first amount of time consistent with a desired overall read data latency for the stacked memory apparatus, and thereby generates the main buffer input signal. In similar manner, second delay controller 73 delays the main read signal by a second amount of time consistent with the desired overall read data latency for the stacked memory apparatus, and thereby generates the main buffer output signal. In certain embodiments of the invention, the first and second amounts of time provided by the first and second delay controllers 71/73 are substantially equal. Alternately, different first and second amounts of time may be used to create temporal or phase distinction between the main buffer input signal and the main buffer output signal. However defined and constituted, the main buffer input signal and the main buffer output signal may be respectively applied to main buffer 51 through corresponding main input and output shift registers 72 and 74.

Figure 7:
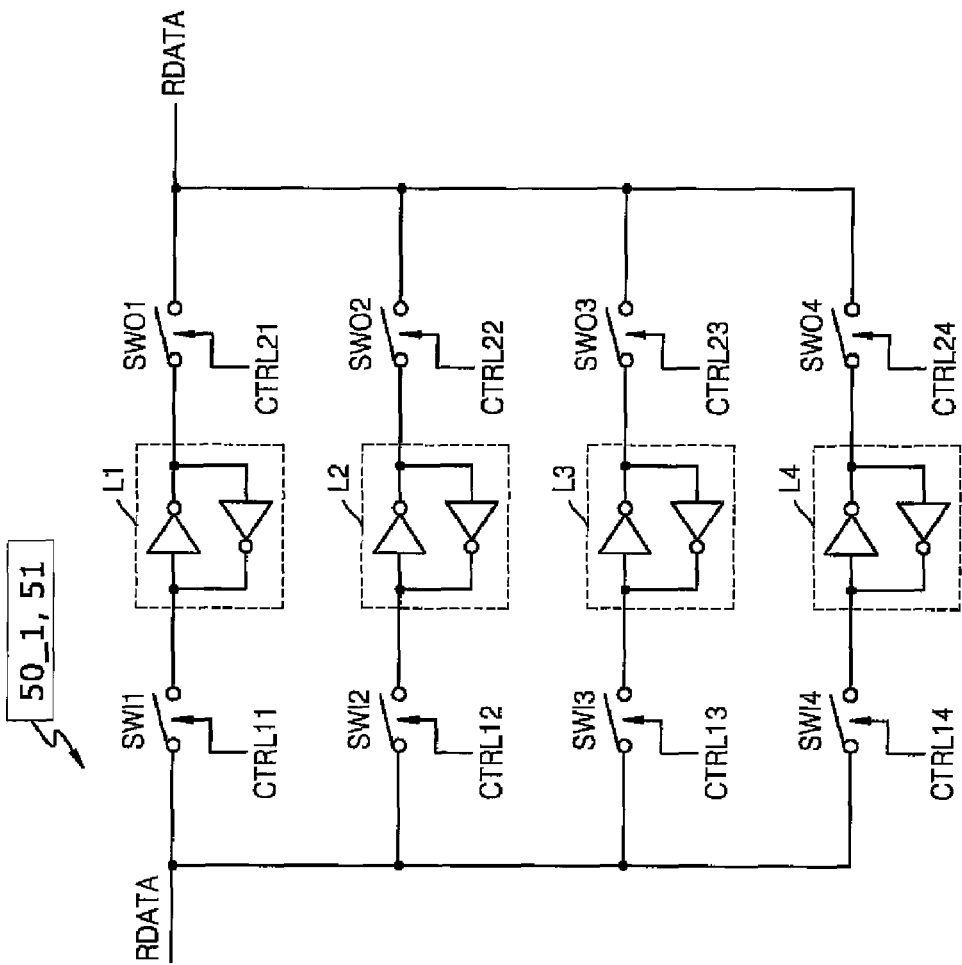
FIG. 7 further illustrates one possible configuration of the device buffer and/or main buffer of the stacked memory apparatus shown in FIGS. 4 and 6.

FIG. 7 further illustrates one possible embodiment of device buffer 50_1 and/or main buffer 51 from the embodiment show in FIG. 6. Here, device buffer 50_1 and/or main buffer 51 is implemented as FIFO comprising a plurality of latches L1 through L4 respectively bracketed by latch input and latch output switches. Fir example, first latch L1 is bracketed by first latch input switch SWI1 actuated by first input switch control signal CNTRL11 and by first latch output switch SWO1 actuated by a first output switch control signal CNTRL21. Second through fourth latches are similarly configured, as shown in FIG. 7. Obviously, the data depth for the FIFO buffer(s) implementing device buffer 50_1 and/or main buffer 51 is a matter of design choice, but FIG. 7 illustrates a FIFO having a four (4) block data depth.

The FIFO illustrated in FIG. 7 operates in a substantially conventional manner. First data comprising one or more data bits selected from the read data is initially received and stored in first latch L1 during a first interval. Second data selected from the read data is then received and stored in second latch L2 during a second interval, and so on, up to the point in time where the FIFO buffer is full. Then the FIFO buffer may be emptied of data in order that the first through fourth data was received, assuming the FIFO buffer is filled before being emptied.

In the embodiments of FIGS. 5 and 6, shift registers 62, 63, 72, 74 are used to apply the device buffer input and output signals and the main buffer input and output signals to the respective input/putout gating elements of device buffer 50_1 and main buffer 51. In the context of the embodiment shown in FIG. 7, respective shift registers may be used to conventionally select (or enable) the various input/output switch control signals controlling the flow of data to/from the FIFO buffer. In one embodiment of the invention, the various shift registers are used to scrolling enablement of the various input/output switch control signals applied device buffer 50_1 and main buffer 51. In this manner, the various latch input/output control switches may be operated to implement the standard functionality of a FIFO buffer within the illustrated embodiments of the invention. As previously noted, there are many other ways to implement the data transfer functionality of a device buffer and/or main buffer associated with various embodiment of the invention.

However, extending the example embodiments illustrated in FIGS. 5-7, FIG. 8 is a timing diagram further illustrating the flow and related timing of control signals and read data in a stacked memory apparatus according to various embodiments of the invention. Beginning with the two upper most lines of the related timing events illustrated in FIG. 8, a read command (RCMD) is received at the interface device (I/F). For the sake of simplicity, it is assumed that a corresponding device read signal is immediately apparent at each one of a plurality of "n" memory devices (MD). That is, an idealized signal decoding and propagation delay of zero is assumed for clarity of illustration.

In response to the device read signal, respective memory devices (1$^{st}$ through 3$^{rd}$) output read data (RDATA). (See, lines 3-5 of FIG. 8) Of further note, each memory core in the respective memory devices outputs read data according to a different access delay time (e.g., 5 ns, 7 ns, and 9 ns) in the illustrated example to highlight the ability of the embodiment to cope with different data access and buffer time periods.

Figure 8A:
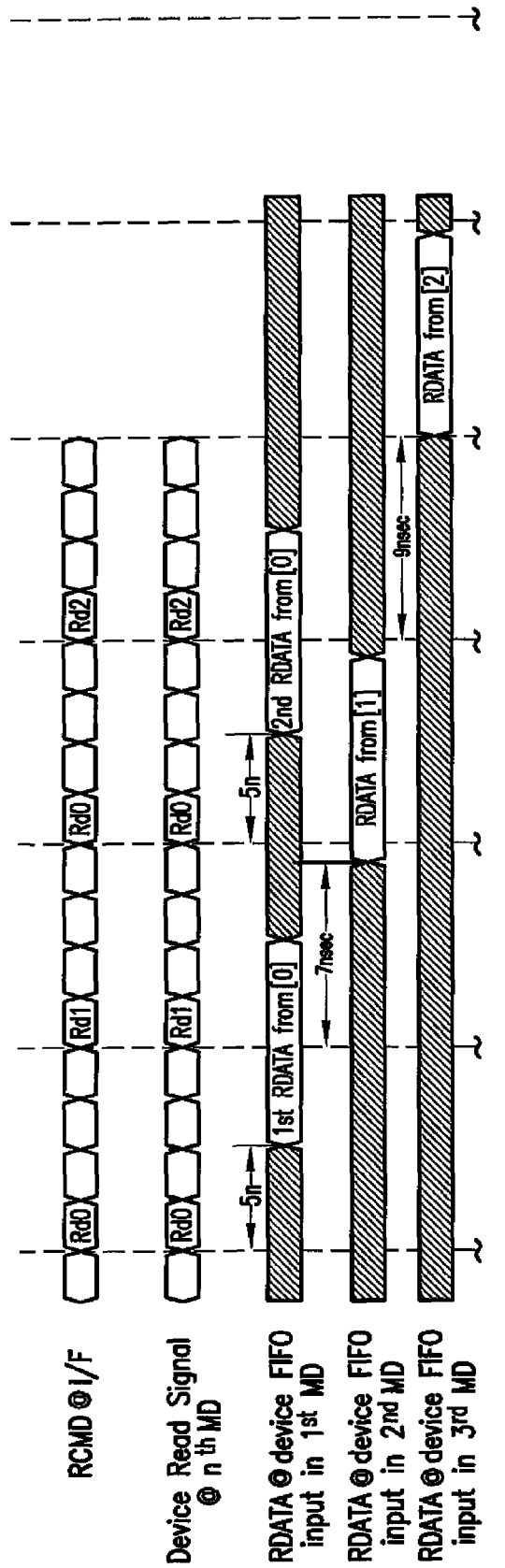
FIG. 8 (collectively FIGS. 8A, 8B, and 8C) is a timing diagram illustrating certain control and data signals for the embodiments illustrated in FIGS. 4-7.
Figure 8B:
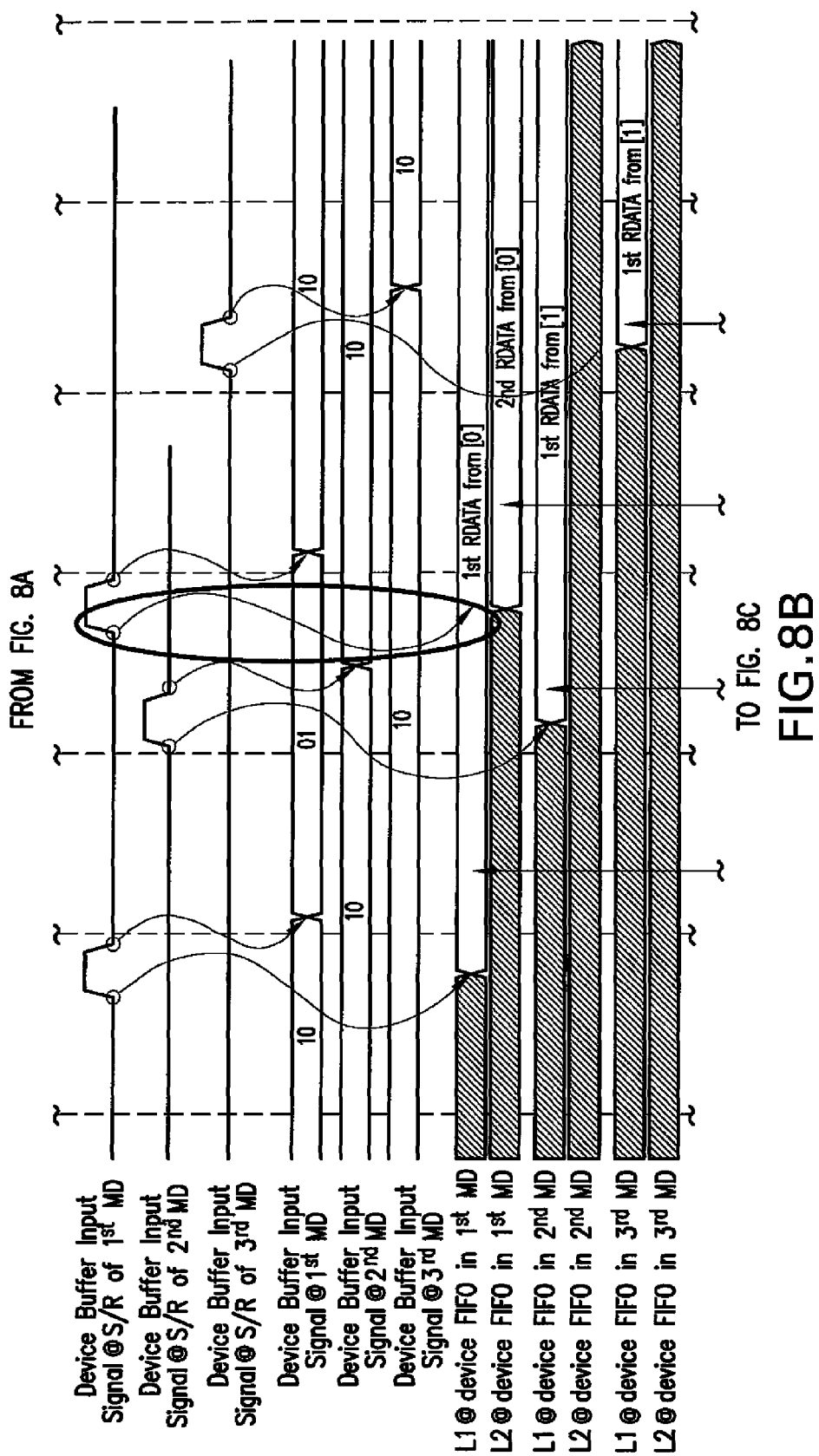
Figure 8C:
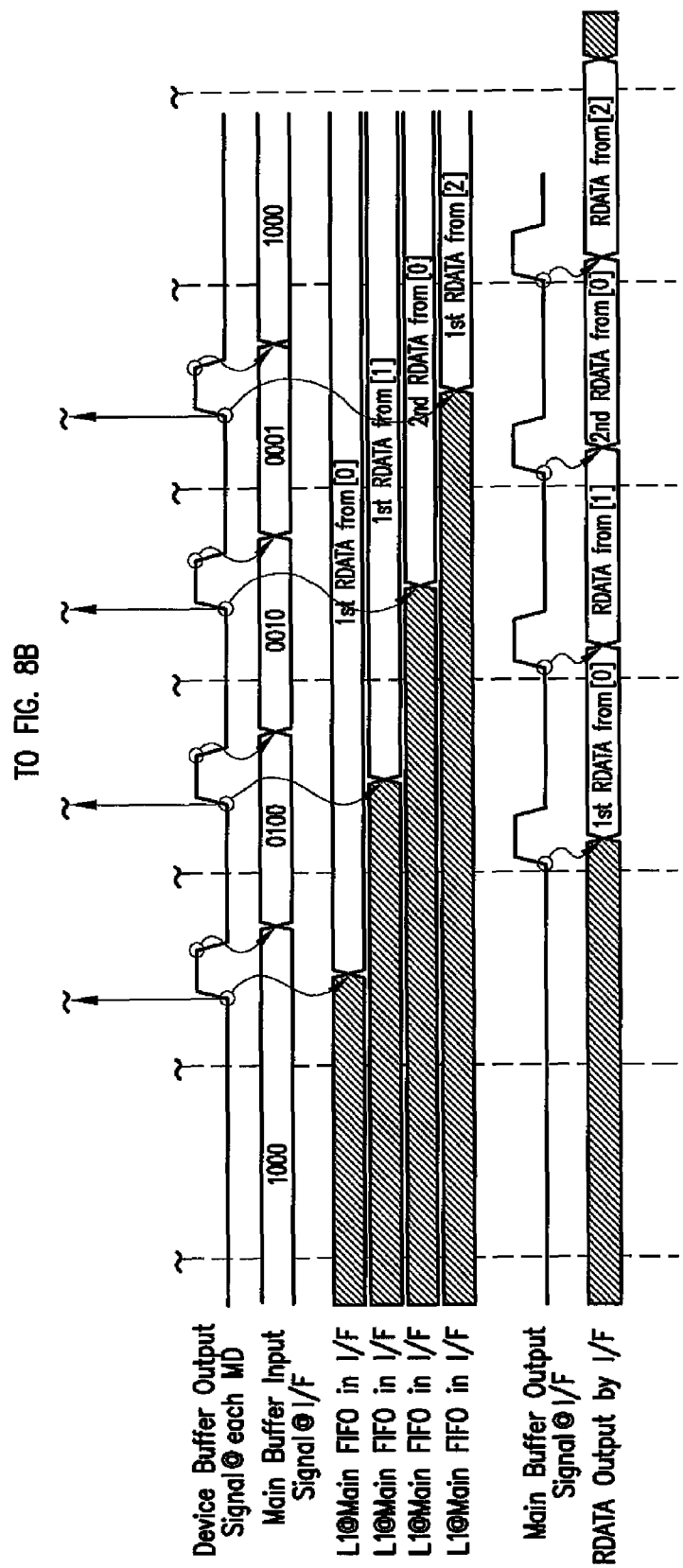

An exemplary delay relationship between the delayed device read signal provided by delay controller 61 and the actual device buffer input signal applied to the respective device buffer (FIFOs) by shift register (S/R) 62 is illustrated by the timing relationships of lines 6-11 of FIG. 8.

The transfer of read data from each one of the plurality of memory devices through a corresponding device FIFO buffer (having an illustrated data depth of two) to a main FIFO buffer (having an illustrated data depth of four) is illustrated by the timing relationships shown in lines 12-19 of FIG. 8. Finally, the transfer of the read data into and from the main FIFO buffer as stacked memory apparatus output data is illustrated by the timing relationships shown in lines 20-25 of FIG. 8.

Figure 9:
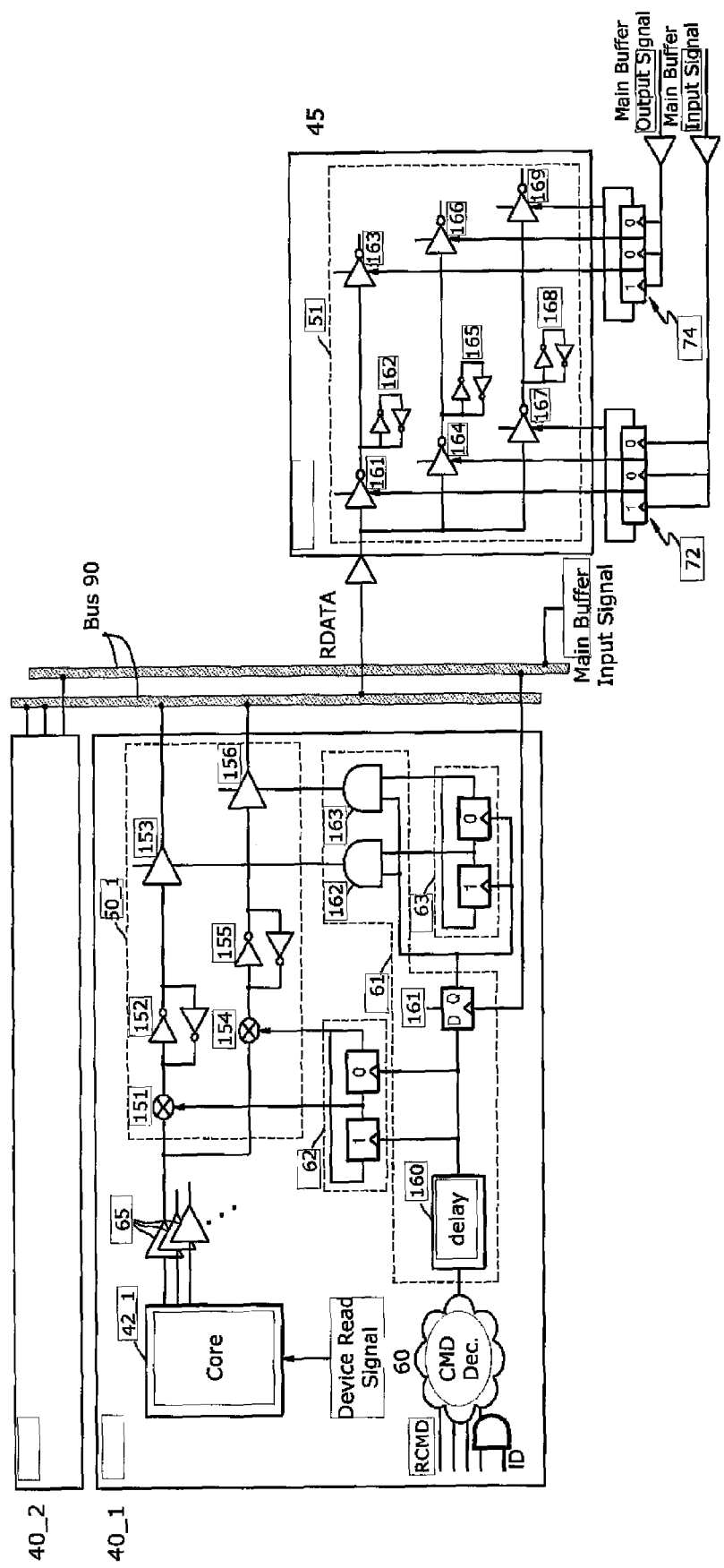
FIG. 9 is another stacked memory apparatus according to an embodiment of the invention.
Figure 10:
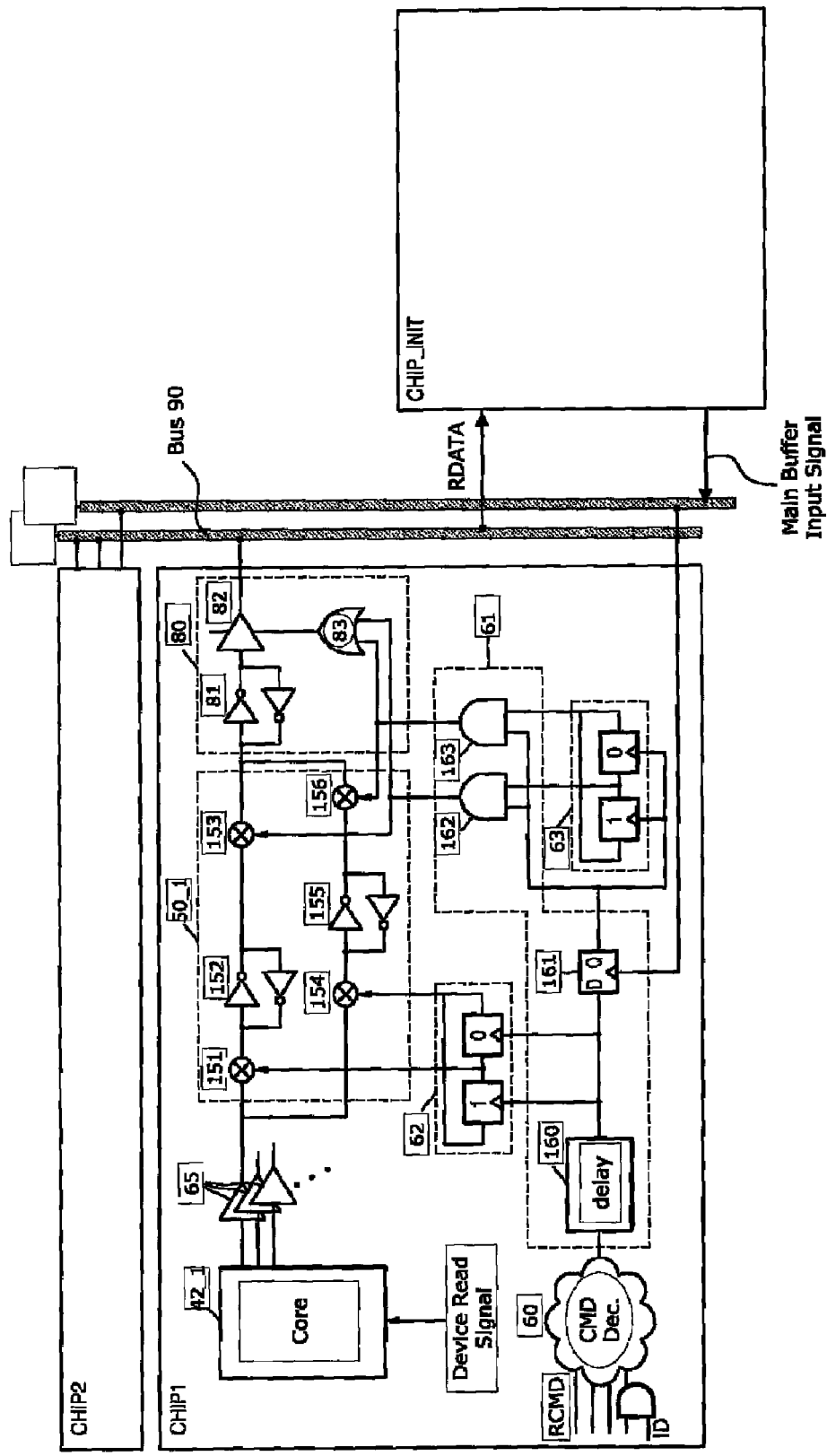
FIG. 10 is another stacked memory apparatus according to an embodiment of the invention.

FIGS. 9 and 10 further illustrate possible embodiments for first delay controller (D/C) 61, input/output shift registers 62 and 63, and device buffer 50_1 of FIG. 6, as well as main buffer 51 and related input/output shifted registers 72 and 74. As previously noted, the use of shift registers 62, 63, 72 and 74 to apply various control signals to the input and output gating elements of a FIFO is deemed conventional. Such shift registers may have any reasonable length commensurate with the arbitrarily defined depth of the respective device FIFO buffer 50_1 and main buffer 51. Thus, in the illustrated example, as the device FIFO buffer 50_1 has a depth of two, device input/output shift registers 62 and 63 include two elements (e.g., flip-flop), and as main buffer 51 has a depth of three, main input/output shift registers 72 and 74 include three elements.

First delay controller 61 comprises a delay element 160 imparting a delay preferably equal to or defined in relation to the read data access and buffer time associated with memory core 42_1. This read access and buffer time may be defined in part by certain delay elements 65 inherently or additionally associated with memory core 42_1. A latch 161 is gated by the main buffer input signal respectively communicated from the interface device 45 to each one of the plurality of memory devices 40 via a signal bus 90. A delayed version of the device read signal applied to memory core 42_1 is provided by delay element 160 to input shift register 62. The output of shift register 62 is the device buffer input signal applied to first transmission switch 151 and second transmission switch 154 which serve as read data input gating elements for device buffer 50_1. Read data may thus by respective gated into latching circuits 152 and 155, and then output via tri-state buffers 153 and 156.

The respective tri-state buffers 153 and 156 are gated in their output by the device buffer output signal received from output shifter register 63 through control logic 162 and 163 included in first delay controller 61. The read data provided by tri-state buffers 153 and 156, as controlled by the device buffer output signal, is communicated to the main buffer 51 via bus 90.

In the embodiment of FIG. 9, main buffer 51 is implemented with latches 162, 165, and 168 bracketed by respective input/output switches 161/163, 164/166, and 167/169 as described above in relation to FIG. 7. The main buffer input signal scroll-shifted and applied through input shift register 72 controls the operation of the input switches, and the main buffer output signal scroll-shifted and applied through output shift register 74 controls the operation of the output switches of main FIFO buffer 51.

The embodiment illustrated in FIG. 10 is largely the same as the embodiment illustrated in FIG. 9, except the dual tri-state buffers 153 and 156 are replaced by second transmission switches 153 and 156 and a serializer unit 80 receiving and serializing the read data outputs from both second transmission switches 153 and 156. In the illustrated embodiment of FIG. 10, serializer unit 80 comprises an output latch 81, control logic gate 83 and a single tri-state buffer 82 connected to bus 90.

Of further note in relation to the embodiments shown in FIGS. 9 and 10, a chip selection (or chip identification "ID") signal may be used in conjunction with the read command applied to at least one command decoder 60 associated with the stacked plurality of memory devices 40_1 through 40_n. Where used, the chip selection signal enables one or more selected memory devise from which data will be read. Those skilled in the art will recognize that the chip identification signal ID may be variously derived from conventionally understood chip selection and/or addressing signals.

The foregoing illustrated embodiments have focused on different stacked memory apparatuses, but the invention is by no means limited to only single integrated circuit packages implementing a stacked memory apparatus. Indeed, a range of systems and sub-systems are susceptible to the benefits of the present invention.

For example, memory apparatuses are commonly ganged onto a memory module in order to provide large amounts of data storage or increased data bandwidth within a host device. FIG. 11 conceptually illustrates a memory module 100 comprising a plurality of memory apparatuses 101 connected to a module bus 92. One or more of the plurality of memory apparatuses 101 in the memory module of FIG. 11 may be a stacked memory apparatus according to an embodiment of the invention, such as those described in relation to FIG. 5, 6, 9 or 10. The interface device of each stacked memory apparatus may be operatively mounted on the memory module board (or "card") supporting the plurality of memory apparatuses. Each respective interface device may be used in conjunction with module bus 92 to communicate read data to and receive control signals from a memory controller 110 via a channel 95.

The architecture and operating principals of memory modules, corresponding memory controllers and connecting channels are well understood by those skilled in the art. And since certain stacked memory apparatuses configured and operated in accordance with an embodiment of the invention may be used as direct replacements for conventional single die memory devices or conventional stacked memory apparatuses, the integration of the stacked memory apparatuses is considered to be well within ordinary skill in the art.

Thus, a memory module incorporating one or more stacked memory apparatuses according to an embodiment of the invention may be used to implement a memory sub-system. In related embodiments, memory control 110 may be mounted on the same board supporting the plurality of memory apparatuses. Alternately, a memory controller may be omitted and the plurality of memory apparatuses on the memory board may be directly accessed by a host system processor.

The large data bandwidth provided by a stacked memory apparatus according to an embodiment of the invention make such apparatuses an excellent choice for data-intensive computational systems. FIG. 12 conceptually illustrates such a system which comprises; a Central Processing Unit (CPU) 201, a first data switch (or North Bridge) 94 connecting CPU 201 to other system components like memory system 200, graphics card 204, and a second data switch (or South Bridge) 203 connecting local buses and/or system I/O devices. Memory system 200 may comprise one or more stacked memory apparatuses according to an embodiment of the invention, and/or a memory module per FIG. 11.

In contemporary computer systems and consumer electronic devices, the demand for great data bandwidth (i.e., large amounts of data accessed at high speed) is increasing. Multi-core CPUs running sophisticated applications and graphics cards providing enhanced graphics are convenient examples of system components demanding high data bandwidth. A stacked memory apparatus according to an embodiment of the invention is capable of providing high data bandwidth from a integrated circuit package occupying a relatively small lateral surface area on a memory module and/or a system board.

In the foregoing embodiments, memory devices have been described as having a single (or a unitary) memory core. However, this need not be the case. Some emerging memory devices having multiple memory cores and may be adapted for use within an embodiment of the invention. For example, a stacked memory apparatus comprising a plurality of memory devices, where each memory device comprises dual memory cores, may include respective device buffers or a common device buffer accepting read data from one or both memory core. However, configured or accessed, multi-core memory device may be functionally treated as "the memory core" of the memory device within the context of embodiments of the invention.

Further, the foregoing embodiments have assumed for the sake of clarity that read data identified by a read command is entirely stored in one of the stacked plurality of memory devices, or in the interface device. Again, this need not be the case. Those of ordinary skill in the art will understand that an identified block of read data may be stored across multiple memory devices in the plurality of memory devices. For example, in the embodiment illustrated in FIG. 4, each memory core 42_1 through 42_4 may be used to store a respective portion of the read data identified by the read command. The respective portions of read data may be transferred from corresponding device buffers 50_1 through 50_4 to main buffer 51 during the read operation in accordance with the teachings set forth above. Such data storage and retrieval options will be the subject of specific memory system design and memory system command protocol definitions.

While the present invention has been particularly shown and described with reference to exemplary embodiments thereof, it will be understood by those of ordinary skill in the art that various changes in form and details may be made therein without departing from the scope of the invention as defined by the following claims and their equivalents.

What is claimed is:

1. A stacked memory apparatus providing read data in response to a read command and comprising:
   an interface device comprising;
      a main control circuit configured to generate a main buffer output signal and a main buffer input signal, and
      a main buffer configured to provide the read data to an external circuit in response to the main buffer output signal; and
   a plurality of memory devices vertically stacked on the interface device, wherein each memory device in the plurality of memory devices comprises;
      a memory core configured to provide the read data in response to a device read signal,
      a device buffer configured to receive the read data from the memory core in response to a device buffer input signal and provide the read data to the main buffer in response to a device buffer output signal, and a device control circuit receiving the read command and the main buffer input signal, and configured to generate the device read signal in response to the read command, the device buffer input signal in relation to a read data access delay associated with the memory core, and the device buffer output signal in relation to the main buffer input signal.

2. The apparatus of claim 1, wherein the interface device is a memory device similar to each one of the plurality of memory devices.

3. The apparatus of claim 1, wherein the interface device is a controller or a master device.

4. The apparatus of claim 1, wherein the main buffer and each device buffer in the plurality of memory devices are respectively First-In First-Out (FIFO) buffers.

5. The apparatus of claim 4, wherein each memory device in the plurality of memory devices further comprises an Input/Output (I/O) driver and each device buffer is configured within a corresponding I/O driver.

6. The apparatus of claim 5, wherein the interface device further comprises a read controller configured to transfer the read data from the main buffer to an external circuit.

7. The apparatus of claim 6, wherein the interface device further comprises a write controller configured to transfer write data from an external circuit to a write buffer, wherein the write buffer is configured to provide the write data from the write controller to an I/O driver in one of the plurality of memory devices.

8. The apparatus of claim 1, wherein the device control circuit comprises:
a first command decoder configured to generate the device read signal in response to the read command; and
a first delay unit configured to generate the device buffer input signal in response to the device read signal.

9. The apparatus of claim 8, wherein the first delay unit comprises a first delay controller receiving the device read signal and delaying the device read signal by the read data access delay to generate the device buffer input signal.

10. The apparatus of claim 8, wherein the main control circuit comprises:
a second command decoder configured to generate a main read signal in response to the read command;
a second delay unit configured to generate the main buffer output signal in response to the main read signal; and
a third delay unit configured to generate the main buffer input signal in response to the main read signal.

11. The apparatus of claim 10, wherein the second delay unit comprises a second delay controller receiving the main read signal and delaying the main read signal by a read data output delay to generate the main buffer output signal, and the third delay unit comprise a third delay controller receiving the main read signal and delaying the main read signal by a read data compensation delay to generate the main buffer input signal.

12. The apparatus of claim 11, wherein the read data output delay is defined in relation to an external clock associated with the read command.

13. The apparatus of claim 1, wherein stack adjacent memory devices in the plurality of memory devices are connected by at least one Through Silicon Via (TSV).

14. The apparatus of claim 13, wherein the plurality of memory devices commonly receive an address signal via a plurality of parallel address signal lines, wherein each one of the plurality of address signal lines comprises a plurality of TSVs, each TSV in the plurality of TSVs respectively extending through one of the plurality of memory devices.

15. The apparatus of claim 14, wherein each memory core in each one of the plurality of memory devices comprises; a core, a row decoder, a column decoder, and an Input/Output (I/O) driver comprising the device buffer, and
wherein the row decoder and column decoder in at least one responding memory device in the plurality of memory devices selects the read data from the core in accordance with the address signal and provides the selected read data to the device buffer in the I/O driver.

16. The apparatus of claim 14, wherein the plurality of memory devices are selectively controlled by a memory stack control signal communicated to the plurality of memory devices by a serial signal line traversing the stacked plurality of memory devices, wherein the serial signal line comprises a plurality of TSVs each TSV in the plurality of TSVs respectively extending through one of the plurality of memory devices.

17. The apparatus of claim 16, wherein each memory core in each one of the plurality of memory devices comprises; a core, a row decoder, a column decoder, and an Input/Output (I/O) driver comprising the device buffer, and
wherein the row decoder and column decoder in at least one responding memory device in the plurality of memory devices selects the read data from the core in accordance with the address signal and provides the selected read data to the device buffer in the I/O driver, and the at least one responding memory device is determined by the memory stack control signal.

18. A system comprising:
at least one memory apparatus; and
a processor communicating to the at least one memory apparatus a read command identifying read data,
wherein each one of the at least one memory apparatus comprises an interface device and a plurality of memory devices vertically stacked on the interface device;
the interface device comprising a main control circuit configured to generate a main buffer output signal and a main buffer input signal, and a main buffer configured to provide the read data in response to the main buffer output signal; and
each one of the plurality of memory devices comprising,
a memory core configured to provide the read data in response to a device read signal,
a device buffer configured to receive the read data from the memory core in response to a device buffer input signal and provide the read data to the main buffer in response to a device buffer output signal, and
a device control circuit receiving the read command and the main buffer input signal and configured to generate the device read signal in response to the read command, the device buffer input signal in relation to a read data access delay associated with the memory core, and the device buffer output signal in relation to the main buffer input signal.

19. The system of claim 18, wherein the interface device is one of a memory device, a master memory device, and a memory controller.

20. The system of claim 18, further comprising:
a memory controller receiving the read command from the processor and configured to generate an address signal and a control signal in response to the read command,
wherein the at least one memory apparatus comprises a memory module configured to operatively associate a plurality of memory apparatuses with the memory controller, such that each one of the plurality of memory apparatuses receives the address signal and the control signal.

21. The system of claim 20, further comprising:
a data bridge circuit connecting the processor with the memory controller and configured to communicate the read command from the processor to the memory controller and communicate the read data from at least the one of the plurality of memory apparatuses to a read/write memory associated with the processor.

22. The system of claim 21, further comprising:
a graphics processor connected to the memory controller via the data bridge and configured to receive the read data from at least the one of the plurality of memory apparatuses in response to the read command.

23. The system of claim 18, wherein each one of the at least one memory apparatus is a Dynamic Random Access Memory (DRAM) device or a Static Random Access Memory (SRAM) device.

24. The system of claim 18, wherein each one of the at least one memory apparatus is a non-volatile memory device.

25. The system of claim 24, wherein each one of the at least one memory apparatus is a flash memory device.

* * * * *